(12) United States Patent
Carretti et al.

(10) Patent No.: US 8,278,675 B2
(45) Date of Patent: Oct. 2, 2012

(54) WHITE OR ULTRAVIOLET LEDS CONTAINING A GETTER SYSTEM

(75) Inventors: Corrado Carretti, Milan (IT); Roberto Giannantonio, Oleggio (IT); Sergio Rondena, Magenta (IT)

(73) Assignee: Saes Getters S.p.A., Lainate (MI) (IT)

( * ) Notice: Subject to any disclaimer, the term of this patent is extended or adjusted under 35 U.S.C. 154(b) by 562 days.

(21) Appl. No.: 12/602,585

(22) PCT Filed: Jun. 13, 2008

(86) PCT No.: PCT/EP2008/057483
§ 371 (c)(1),
(2), (4) Date: Dec. 1, 2009

(87) PCT Pub. No.: WO2008/155295
PCT Pub. Date: Dec. 24, 2008

(65) Prior Publication Data
US 2010/0176409 A1    Jul. 15, 2010

(30) Foreign Application Priority Data
Jun. 20, 2007 (IT) .............. MI2007A1238

(51) Int. Cl.
*H01L 33/00* (2010.01)
(52) U.S. Cl. .................. 257/98; 257/E33.072

(58) Field of Classification Search ............ 257/98, 257/99, E33.072
See application file for complete search history.

(56) References Cited

U.S. PATENT DOCUMENTS

| | | | |
|---|---|---|---|
| 5,882,727 A | 3/1999 | Corazza et al. | |
| 2005/0116614 A1 | 6/2005 | Kidoguch et al. | |
| 2010/0176409 A1* | 7/2010 | Carretti et al. | 257/98 |

FOREIGN PATENT DOCUMENTS

| | | |
|---|---|---|
| EP | 1641048 | 3/2006 |
| JP | 56061761 | 5/1981 |
| JP | 05343812 | 12/1993 |
| KR | 100747325 | 8/2007 |
| WO | 2005/106958 | 11/2005 |
| WO | 2007013120 | 2/2007 |
| WO | 2004/072604 | 8/2007 |

OTHER PUBLICATIONS

PCT International Search Report for PCT/EP2008/057483 filed on Jun. 13, 2008 in the name of SAES Getters S.p.A.
PCT Written Opinion for PCT/EP2008/057483 filed on Jun. 13, 2008 in the name of SAES Getters S.p.A.

* cited by examiner

*Primary Examiner* — Mark Prenty
(74) *Attorney, Agent, or Firm* — Steinfl & Bruno LLP

(57) ABSTRACT

LEDs (30) are described containing a getter system comprising a getter material (13) and a metallic part (10), in which the getter material is optically shielded from the metallic part.

3 Claims, 3 Drawing Sheets

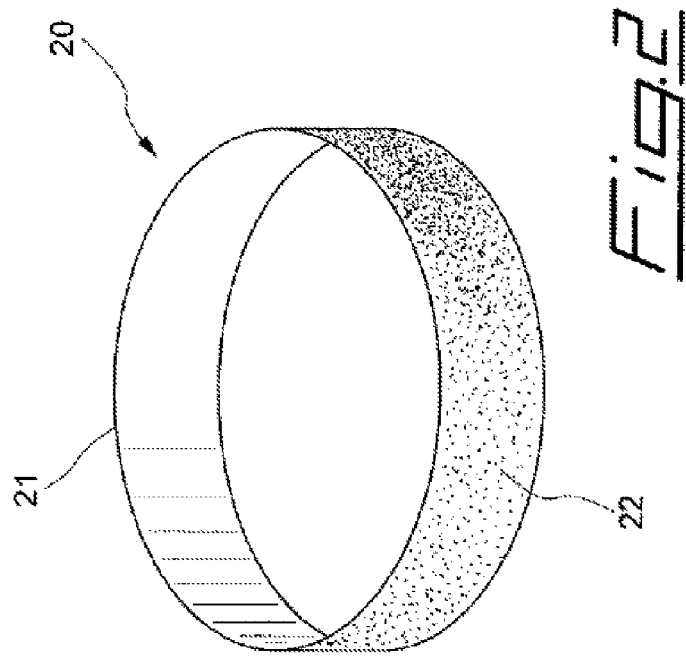
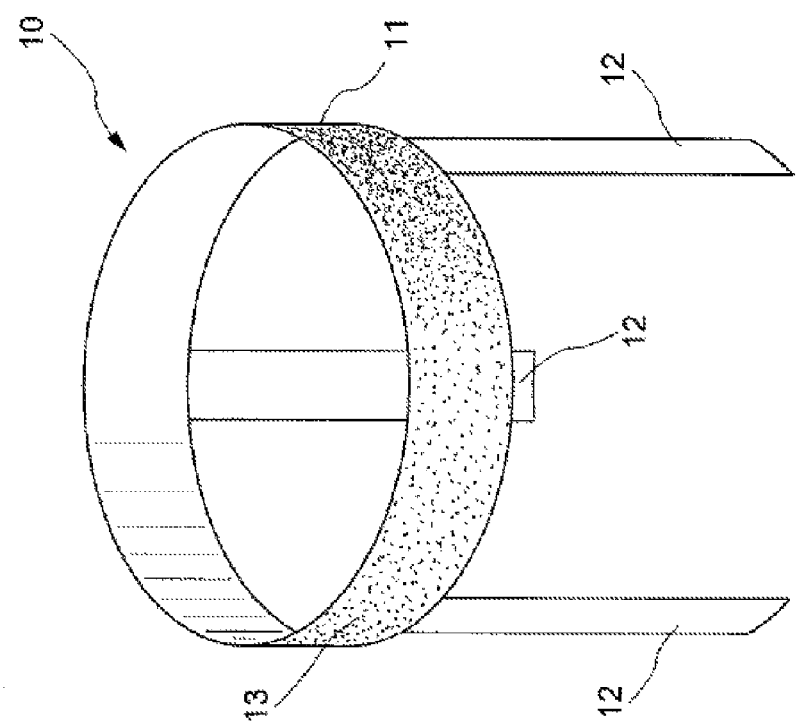

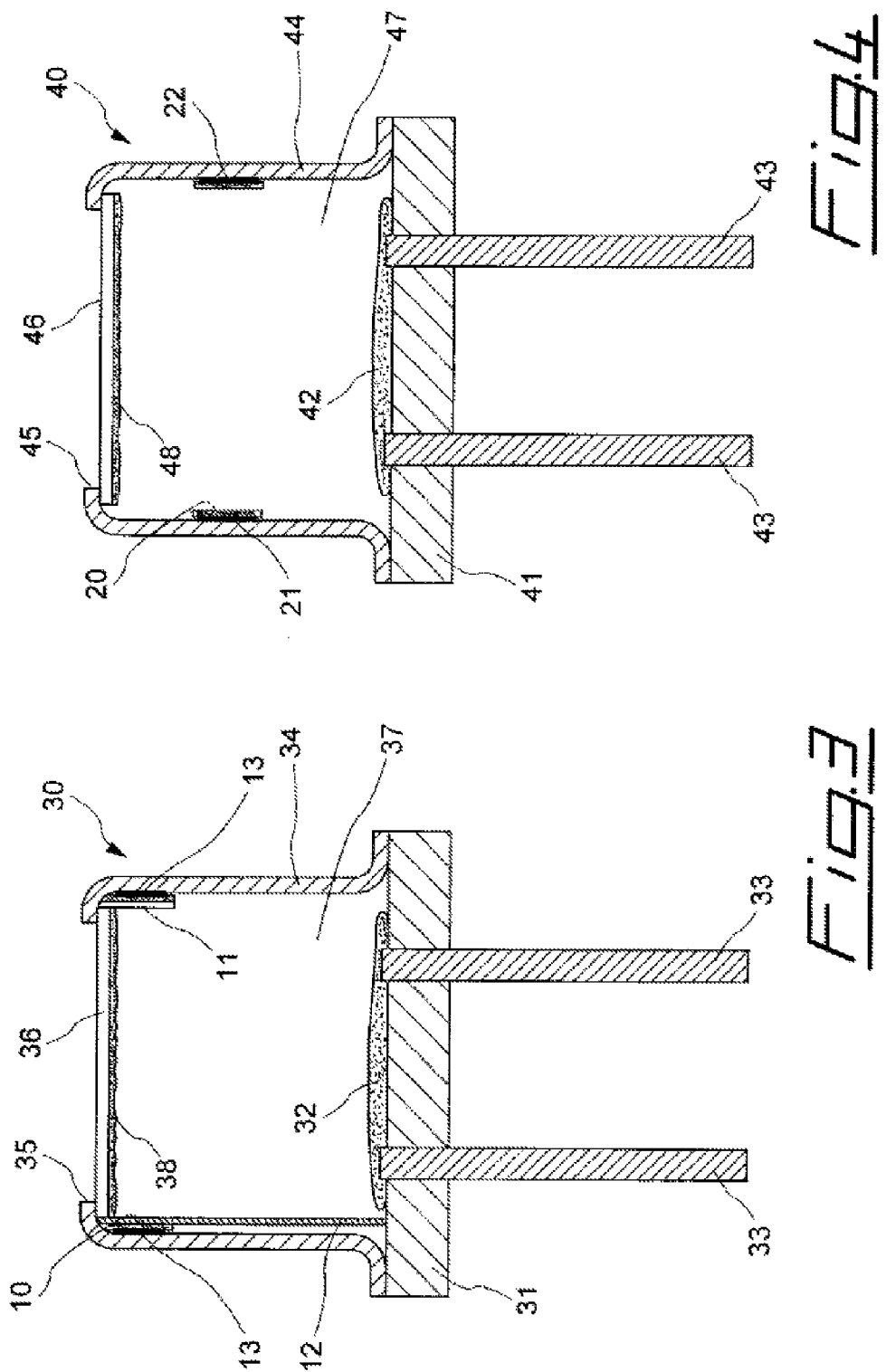

WHITE OR ULTRAVIOLET LEDS CONTAINING A GETTER SYSTEM

CROSS REFERENCE TO RELATED APPLICATIONS

The present application is the national stage of International Application PCT/EP2008/057483 filed on Jun. 13, 2008 which, in turn, claims priority to Italian Application MI2007A001238, filed on Jun. 20, 2007.

The present invention relates to white or ultraviolet LEDs containing a getter system.

LEDs (Light Emitting Diodes) are used as light sources in various applications, such as traffic lights, lighting signs in general, torches or marking lights in cars, backlight of liquid crystal displays and various other applications that are currently being developed. The diffusion of this type of light source requires the availability of white LED sources.

The emission of light in LEDs is caused by the recombination of electrons and electronic holes in a semiconductor material, such as aluminum gallium arsenide (AlGaAs), gallium nitride (GaN), aluminum nitride (AlN) or the like. Every semiconductor material emits light only in certain ranges of the spectrum: for example AlGaAs in the infrared and red, GaN in the green and blue, AlN in the ultraviolet (UV).

To create white light it is therefore possible to use three different LEDs that emit the three primary colors; this solution however is not much appreciated, especially in applications in which the available space is limited. In alternative, it is possible to use a single LED that emits in the UV or in the blue and inside of which there are materials, called phosphors, that absorb these radiations and re-emit light of a higher wavelength. Using a mixture of phosphors that emit in the green and red (in the case of a blue LED) or in the three primary colours (in the case of a UV LED), it is possible to obtain the emission of white light.

The structure of a blue or UV LED is shown in cross section in its essential elements in FIG. 5; generally, the LED consists of a base B (for example made of a metal or a ceramic material) on which there is a deposit of semiconductor material S, connected to electrical feedthroughs L for its power supply. In periphery of the base a cap C, generally made of a metallic material, is fixed in a hermetic way. The part of the cap in front of the base has an opening closed by a glass V to allow the light emission of the LED; the glass is fixed hermetically at its periphery to the edges of the opening, for example by means of a brazing paste (not shown). On the surface of the glass facing the inside of the LED a layer of phosphors F is deposited. The assembly consisting of base, cap and glass forms a sealed space I, which during the production of the LED is filled with an inert gas, typically at atmospheric pressure; in this way the operating parts of the LED are protected from the surrounding atmosphere (that is, from the chemical attack of the atmospheric gases) as well as mechanically.

However, in the production process of these LEDs, traces of oxygen remain trapped in space I. Another possible source of oxygen results from the outgassing of components and materials when high temperature processes are carried out, especially those related to the sealing of the device.

It has been observed that oxygen causes degradation effects of the phosphors with a consequent reduction with time of the luminous efficiency of the LED; besides, although there are no definitive proofs in this respect, it is believed that also water can have a negative effect on the functioning of the LED.

The problem was already discussed in patent application WO 2005/106958 in the name of the Applicant. This application teaches the use of a getter material, that is a material capable of sorbing traces of reactive gases, inside of space I; as examples calcium oxide for the sorption of humidity and an alloy of zirconium-cobalt-rare earths (produced and sold by the Applicant under the name St 787®) for the sorption of other gases, among which oxygen, are cited. According to the teachings of this application, the getter material is deposited onto one of the internal surfaces that define space I and facing the same. However, it has been observed that with this configuration the blue or UV radiation emitted from the active material and incident onto the getter is not reflected (or is reflected only in a minimal part) due to the surface morphology and therefore does not reach the phosphors, thus causing a loss of luminous efficiency of the LED.

Object of the present invention is to provide a LED containing a getter material which is free of the above-mentioned problem.

According to the invention this object is achieved with a LED consisting of: a base on which there is a deposit of a semiconductor material; feedthroughs for the power supply of the deposit of semiconductor material; a cap, hermetically fixed at the periphery of the base and having an opening in its part in front of said base; a glass having on its surface facing the inside of the LED a layer of phosphors and in turn hermetically fixed to the edges of said opening, in such a way that the assembly consisting of base, cap and glass forms a sealed space; wherein said space is filled with an inert gas, encloses the deposit of semiconductor material and contains a getter material, characterized in that the getter material is deposited onto only one surface of a metallic part arranged in said sealed space in such a way that the surface of said metallic part facing said space is free of getter material.

The invention will be illustrated in the following with reference to the drawings, in which:

FIG. 1 shows a perspective view of a first possible embodiment of the metallic part with a deposit of getter material for use in the LEDs of the invention;

FIG. 2 shows, still in perspective, a second possible embodiment of the metallic part with a deposit of getter material for use in the LEDs of the invention;

FIG. 3 shows in cross section a LED of the invention that contains the metallic part with getter of FIG. 1;

FIG. 4 shows in cross section a LED of the invention that contains the metallic part with getter of FIG. 2.

Figure 5:
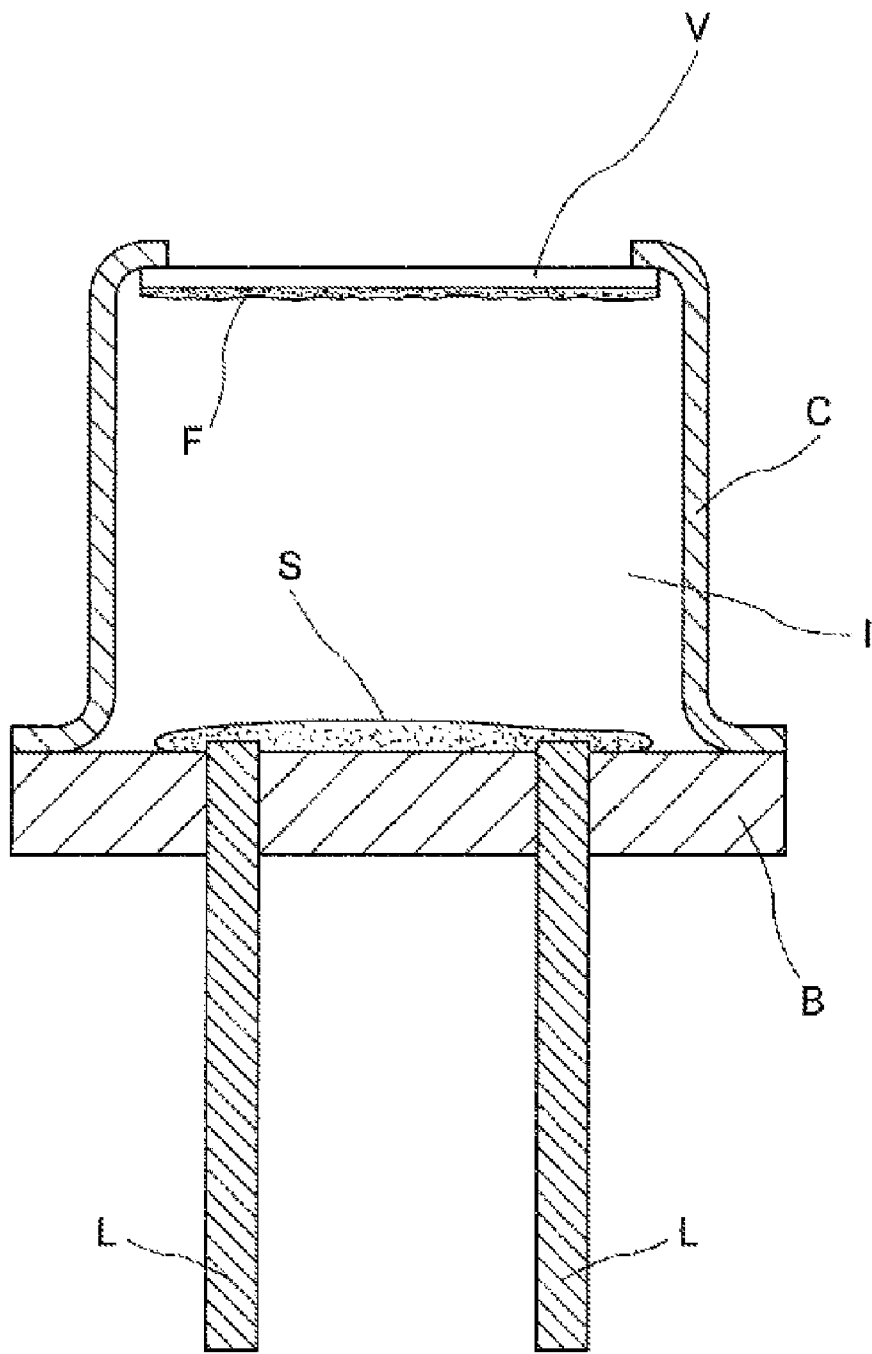
FIG. 5, already discussed in the introduction of the specification, shows in cross section a LED in its most generic form.

FIG. 1 shows a first metallic part with getter for use in the LEDs of the invention. Part 10 has the form of a metallic band 11 with three "legs" 12; with the term "metallic band" a band in form of a ring made of pure metal or a metallic alloy is meant. The "legs" may be formed by cutting from the same metallic sheet from which the band 11 is formed, or may be produced separately and subsequently fixed to the band, for example by welding. The external surface of the band 11 is coated with a deposit of getter material 13.

FIG. 2 shows an alternative embodiment of metallic part with getter for use in the LEDs of the invention. In this case the metallic part 20 is merely formed of a metallic band 21 wearing on its outer surface a deposit of getter material 22.

Both in case of band 11 and of band 21, for the sake of simplicity, the drawings show an element that is closed like a ring, as it can be obtained by cutting a cylindrical surface; however, these bands are commonly produced starting from a metallic sheet onto one of the surfaces of which the getter material is deposited, cutting pieces from this sheet, and rolling the pieces up to a circle; the circle may be closed, for example by welding the two opposite ends of the piece, or these may simply be made to overlap but not fixed to each other.

The material from which the band 11 or 21 is made can be any metal (or alloy) able to resist to the production conditions of the LED, and thus to the temperatures reached during the welding or brazing operations necessary to fix in a hermetic way the cap to the base and to the glass; because the temperatures reached during the fixation operations of the cap depend on the specific type of operation, the metal of the band must be chosen consequently. In the practice the preferred materials are Kovar (an alloy mainly composed of iron, nickel and cobalt) because it has a thermal expansion coefficient similar to that of the glasses used to form element V of FIG. 5, or various types of steel.

The getter material can be a single material, for example, titanium, zirconium or niobium. More commonly getter alloys are used, generally titanium and/or zirconium based alloys, having at least another element chosen among the transition elements, the rare earths and aluminum. In this case the adhesion to the band 11 or 21 can be obtained in various ways, for example by cold rolling or by serigraphy followed by a thermal treatment for removing the solvent and stabilizing the deposit, as described in U.S. Pat. No. 5,882,727 in the name of the Applicant, or by thin layer deposition techniques, such as sputtering or the like.

In the specific case of water sorption, the getter material is preferably an oxide of an alkaline earth metal chosen among magnesium, calcium, strontium or barium; in this case the getter material is made to adhere to the band preferably by introducing the same into a polymeric matrix, for example as described in patent application WO 2004/072604 in the name of the Applicant.

FIG. 3 shows a LED of the invention in cross section. The LED 30 is formed of base 31 on which there is a semiconductor material 32 connected to electric feedthroughs 33; at the edge of the base cap 34, which has an opening 35 in its part opposite to the base, is fixed hermetically; in proximity to the edge of opening 35 there is fixed a glass 36, whose surface facing the internal space 37 of the LED is coated with phosphors 38. The space 37 also houses the metallic part 10 shown in FIG. 1: the drawing shows, in cross section, only one leg 12, because the three legs are arranged at 120° from one another along the circumference of the band 11 (whereby the other two legs are not visible in a cross section view). Part 10 is arranged in space 37 in such a way that the legs rest on base 31 and that the getter deposit 13 is facing the internal surface of the cap 34. With this configuration the getter is accessible to the traces of harmful gases in space 37, also thanks to the wide spaces between the three legs 12, while all the surfaces of part 10 facing space 37, and therefore in a possible optical path of radiations that are emitted by the semiconductor deposit 32, are reflective and can re-direct the radiation towards the phosphors 38.

FIG. 4, similar to FIG. 3, shows a LED that contains the metallic part 20. Also in this case the LED 40 is formed of a base 41 with a deposit of semiconductor material 42 and electrical feedthroughs 43, a cap 44 fixed at the periphery of the base and having an opening 45, and a glass 46 fixed in proximity of the opening 45, and with a deposit of phosphors 48 on the surface of the glass facing the internal space 47 of the LED. Against the internal surface of cap 44 the metallic part 20 is fixed, formed by the band 21 that carries the getter deposit 22 only on its surface that is facing the internal surface of the cap, while the surface of band 21 facing space 47 is free of deposits and thus reflective. A band of type 20 can be held in position for example by one ore more welding spots; in alternative, it is possible to use a band made from an elastic metal, for example hardened spring steel, and to use its natural tendency to return to the planar configuration and consequently its thrust against the internal walls of the cap to keep it in position.

In FIGS. 3 and 4 embodiments are shown in which the deposit of getter material extends on a limited height portion of the cap of the LED, but it is also possible that the deposit has a larger extension arriving, in some special embodiments, also to cover the largest part of the height of the cap of the LED; obviously such a deposit of getter material must be shielded from the metallic part of the getter system. In those cases in which the metallic part that shields the getter material results to cover a significant part of the height of the cap, it can be useful to deposit or arrange a multi-layer reflecting UV radiation onto the metallic part of the getter system, in order to improve its reflecting efficiency.

The invention claimed is:

1. LED consisting of:
   a base on which there is a deposit of semiconductor material;
   feedthroughs for the electrical power supply of the deposit of semiconductor material;
   a cap hermetically fixed at the periphery of the base and having an opening in its part in front of said base;
   a glass having on its surface facing the inside of the LED a layer of phosphors and in turn hermetically fixed to the edges of said opening, in such a way that the assembly consisting of base, cap and glass forms a sealed space;
   wherein said space is filled with an inert gas, encloses the deposit of semiconductor material and contains a getter material, wherein the getter material is deposited onto only one surface of a metallic part arranged in said sealed space in such a way that the surface of said metallic part facing said space is free of getter material.

2. LED according to claim 1, in which said metallic part is housed in said sealed space and comprises a band having the form of a ring from which three legs extend, arranged at 120° from one another and that rest on said base.

3. LED according to claim 1, in which said metallic part is formed of a metallic band having the form of a ring held in position against the internal surface of the cap by welding spots or the elastic characteristics thereof.

* * * * *